(12) United States Patent
Jung

(10) Patent No.: US 7,879,729 B2
(45) Date of Patent: Feb. 1, 2011

(54) METHOD OF FORMING A MICRO PATTERN OF A SEMICONDUCTOR DEVICE

(75) Inventor: Woo Yung Jung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 172 days.

(21) Appl. No.: 12/055,236

(22) Filed: Mar. 25, 2008

(65) Prior Publication Data
US 2009/0170330 A1 Jul. 2, 2009

(30) Foreign Application Priority Data
Dec. 27, 2007 (KR) .................. 10-2007-0138492

(51) Int. Cl.
*H01L 21/311* (2006.01)
*H01L 21/302* (2006.01)
*H01L 21/461* (2006.01)

(52) U.S. Cl. .................. 438/703; 438/700; 438/701; 438/702; 438/736; 438/738; 216/72

(58) Field of Classification Search .. 438/700–703.736, 438/738, 740; 216/72
See application file for complete search history.

(56) References Cited

U.S. PATENT DOCUMENTS

| 7,202,174 | B1 * | 4/2007 | Jung et al. .................. 438/694 |
| 2001/0046791 | A1 * | 11/2001 | Subramanian et al. ...... 438/786 |
| 2005/0285215 | A1 * | 12/2005 | Lee et al. .................. 257/432 |
| 2006/0183265 | A1 * | 8/2006 | Oh et al. .................. 438/65 |
| 2006/0240361 | A1 | 10/2006 | Lee et al. |
| 2006/0273456 | A1 | 12/2006 | Sant et al. |
| 2007/0049011 | A1 | 3/2007 | Tran |
| 2007/0082481 | A1 * | 4/2007 | Jung .................. 438/629 |
| 2008/0090418 | A1 * | 4/2008 | Jeon et al. .................. 438/689 |
| 2008/0248654 | A1 * | 10/2008 | Jung .................. 438/736 |
| 2009/0065940 | A1 * | 3/2009 | Kim et al. .................. 257/754 |

FOREIGN PATENT DOCUMENTS

| KR | 100574999 B1 | 4/2006 |
| KR | 100714305 B1 | 4/2007 |
| KR | 1020070037098 A | 4/2007 |
| KR | 100734464 B1 | 6/2007 |
| KR | 10-0734464 | * 7/2007 |

OTHER PUBLICATIONS

Machine translation of IDS cited patent KR100714305 B1.*
Machine translation of IDS cited patent KR1020070037098 A.*
Jung et al., "Double Patterning of Contact Array with Carbon Polymer," *Proc. Of SPIE* 6924, 6924C (2008).

* cited by examiner

*Primary Examiner*—Ha Tran T Nguyen
*Assistant Examiner*—Karen M Kusumakar
(74) *Attorney, Agent, or Firm*—Townsend and Townsend and Crew LLP

(57) ABSTRACT

In a method of forming micro patterns of a semiconductor device, first etch mask patterns are formed over a semiconductor substrate. An auxiliary film is formed over the semiconductor substrate including a surface of the first etch mask patterns. Second etch mask patterns are formed between the auxiliary films formed on sidewalls of the first etch mask patterns. The first etch mask patterns and the second etch mask patterns are formed using the same material. The auxiliary films between the first and second etch mask patterns are removed. Accordingly, more micro patterns can be formed than allowed by the resolution limit of an exposure apparatus while preventing misalignment.

30 Claims, 5 Drawing Sheets

METHOD OF FORMING A MICRO PATTERN OF A SEMICONDUCTOR DEVICE

CROSS-REFERENCES TO RELATED APPLICATIONS

The present application claims priority to Korean patent application number 10-2007-138492, filed on Dec. 27, 2007, which is incorporated by reference in its entirety.

BACKGROUND OF THE INVENTION

The present invention relates to a method of forming micro patterns of a semiconductor device and, more particularly, to a method of forming micro patterns of a semiconductor device, in which more micro patterns than allowed by a resolution limit of an exposure apparatus can be formed.

In general, the degree of integration of semiconductor devices is concerned with the resolution limit of an exposure apparatus used to fabricate the semiconductor devices. In order to enhance the degree of integration of semiconductor devices, an exposure apparatus with excellent resolution is required. However, as the degree of integration becomes smaller than 40 nm, an exposure apparatus with an excellent resolution is required, which results in increased manufacturing costs.

Research has been conducted to form more micro patterns than the resolution limit of an exposure apparatus allows by changing the manufacturing process. For example, a method has been proposed of forming first photoresist patterns having a pitch, which is twice the pitch of target patterns, and forming second photoresist patterns having the same pitch as that of the first photoresist patterns between the first photoresist patterns. However, if misalignment occurs in an exposure process of forming the second photoresist pattern, a distance between the first photoresist pattern and the second photoresist pattern cannot be maintained uniformly. The likelihood of misalignment increases as the degree of integration increases, which increases the failure rate.

BRIEF SUMMARY OF THE INVENTION

The present invention is directed towards a method of forming first etch mask patterns having a pitch, which is approximately twice the pitch of target patterns, forming second etch mask patterns between the first etch mask patterns in a self-aligned manner, and etching an underlying target etch layer using the first and second etch mask patterns. Thus, the occurrence of misalignment is prevented and more micro patterns may be formed than are allowed by a resolution limit of an exposure apparatus.

A method of forming micro patterns of a semiconductor device according to an aspect of the present invention includes forming first etch mask patterns over a semiconductor substrate. An auxiliary film is formed over the semiconductor substrate including a surface of the first etch mask patterns. Second etch mask patterns are formed between the auxiliary films formed on sidewalls of the first etch mask patterns. The first etch mask patterns and the second etch mask patterns are formed using the same material. The auxiliary films between the first and second etch mask patterns are then removed.

Before the first etch mask patterns are formed, a hard mask film may be formed over the semiconductor substrate and an etch-stop film may also be formed on the hard mask film. The method may further include forming hard mask patterns by etching the etch-stop film and the hard mask film using an etch process employing the first and second etch mask patterns, after the auxiliary films are removed.

The first etch mask patterns may have a pitch, which is approximately twice a pitch of target patterns. A length of the first etch mask pattern between the target patterns may be identical to or longer than that of the target pattern. The formation of the first etch mask patterns includes forming a first etch mask film and an anti-reflective coating (ARC) layer over the semiconductor substrate. First photoresist patterns having a pitch are formed on the ARC layer. The pitch is approximately twice a pitch of target patterns. The first etch mask patterns are formed by patterning the ARC layer and the first etch mask film using an etch process employing the first photoresist patterns. The first photoresist patterns and the ARC layer are then removed.

A distance between the first and second etch mask patterns may correspond to a thickness of the auxiliary film formed on the sidewalls of the first etch mask patterns. A width of a target pattern may correspond to a thickness of the auxiliary film formed on the sidewalls of the first etch mask patterns.

The second etch mask patterns may have a pitch, which is approximately twice a pitch of target patterns. The formation of the second etch mask patterns includes forming a second etch mask film on the auxiliary film such that a space between the auxiliary films formed on the sidewalls of the first etch mask patterns is filled. A second photoresist pattern is formed on the second etch mask film. The second photoresist includes regions where the target patterns will be formed and regions between the target patterns that are exposed the second etch mask patterns are formed by performing an etch process such that the second etch mask film remains between the auxiliary films formed on the sidewalls of the first etch mask patterns. After the auxiliary films are removed, the second photoresist pattern may be removed.

A method of forming micro patterns of a semiconductor device according to another aspect of the present invention includes providing a semiconductor substrate in which junction regions and isolation layers are formed alternately. An interlayer dielectric layer is formed over the semiconductor substrate. First etch mask patterns are formed over the interlayer dielectric layer in regions corresponding to isolation layers belonging to any one of an even-numbered group of the isolation layers and an odd-numbered group of the isolation layers. An auxiliary film is formed over the interlayer dielectric layer including a surface of the first etch mask patterns. Second etch mask patterns are formed between the auxiliary films formed on sidewalls of the first etch mask patterns. The first etch mask patterns and the second etch mask patterns are formed using the same material. The auxiliary films between the first and second etch mask patterns are removed. Contact holes are formed by etching the interlayer dielectric layer at regions from which the auxiliary films have been removed.

The first etch mask pattern may be formed to have a length longer than that of the junction region in a direction in which the junction regions are formed. The junction regions and the isolation layers may be formed alternately between drain select lines of a NAND flash memory device. The first etch mask pattern may be formed to have a length longer than a distance between the drain select lines in a direction crossing the drain select lines. Before the first etch mask patterns are formed, a hard mask film may be formed on the interlayer dielectric layer and an etch-stop film may also be formed on the hard mask film. The method may further include forming hard mask patterns by etching the etch-stop film and the hard mask film using an etch process employing the first and second etch mask patterns, before the contact holes are formed.

The formation of the first etch mask patterns includes forming a first etch mask film and an ARC layer over the interlayer dielectric layer. First photoresist patterns are formed on the ARC layer in regions corresponding to isolation layers belonging to any one of an even-numbered group of the isolation layers and an odd-numbered group of the isolation layers. The first etch mask patterns are formed by patterning the ARC layer and the first etch mask film using an etch process employing the first photoresist patterns. The first photoresist patterns and the ARC layer are then removed.

A distance between the first and second etch mask patterns corresponds to a thickness of the auxiliary film formed on the sidewalls of the first etch mask patterns. A width of the contact hole corresponds to a thickness of the auxiliary film formed on the sidewalls of the first etch mask patterns.

The second etch mask patterns may be formed in regions corresponding to isolation layers belonging to the remaining even-numbered or odd-numbered groups of the isolation layers. The formation of the second etch mask patterns includes forming a second etch mask film on the auxiliary film such that a space between the auxiliary films formed on the sidewalls of the first etch mask patterns is filled. A second photoresist pattern is formed on the second etch mask film. The second photoresist pattern includes regions where the junction regions and the isolation layers are exposed. The second etch mask patterns are formed by performing an etch process employing the second photoresist pattern such that the second etch mask film remains between the auxiliary films formed on the sidewalls of the first etch mask patterns. After the auxiliary films are removed, the second photoresist pattern may be removed.

The first and second etch mask patterns may be formed of a Si-containing Bottom Anti-Reflective Coating (BARC) film. The Si-containing BARC film may be formed using a spin-coating method. The auxiliary film may be formed of a carbon polymer film. The auxiliary film may be removed using an etch process employing $O_2$ plasma.

DESCRIPTION OF SPECIFIC EMBODIMENTS

Specific embodiments according to the present invention will be described with reference to the accompanying drawings. However, the present invention is not limited to the disclosed embodiments, but may be implemented in various configurations. The embodiments are provided to complete the disclosure of the present invention and to allow those having ordinary skill in the art to understand the present invention. The present invention is defined by the scope of the claims.

The present invention is described to illustrate that contact holes can be formed at more micro intervals than the resolution limit of an exposure apparatus will allow. Further, embodiments of the present invention illustrate that contact holes are formed in a row and can be applied to a process of forming a drain contact hole formed between drain select lines in a NAND flash memory device. For convenience of description, embodiments of the present invention are described with reference to a process of forming a drain contact hole of a NAND flash memory device as an example.

FIGS. 1A to 1J are views illustrating a method of forming micro patterns of a semiconductor device according to an embodiment of the present invention.

Figure 1A:
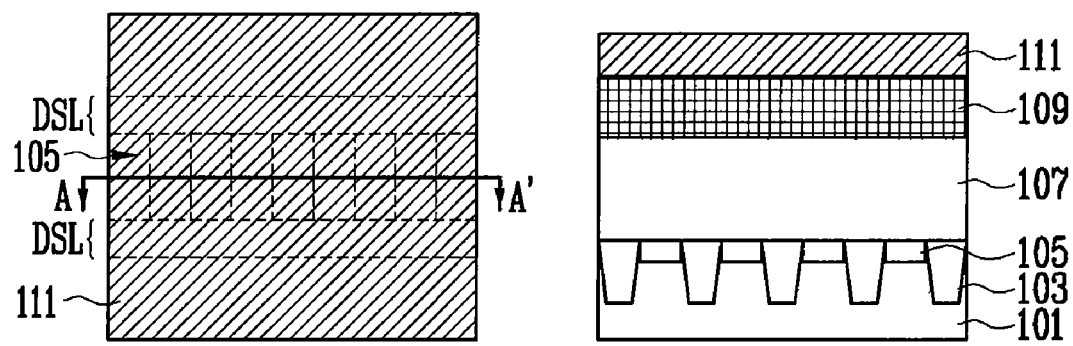
FIGS. 1A to 1J are views illustrating a method of forming micro patterns of a semiconductor device according to an embodiment of the present invention.

Referring to FIG. 1A, a plurality of gate patterns including a drain select line DSL, a word line (not shown), a source select line (not shown) and a gate line (not shown) of a transistor, isolation layers 103, and junction regions 105 are formed over a semiconductor substrate 101. In the case of a NAND flash memory device, the isolation layers 103 and the junction regions 105 are repeatedly arranged between the drain select lines DSL, and contact holes are respectively formed on the junction regions 105 in a subsequent process.

A target etch layer 107, a hard mask film 109 and an etch-stop film 111 are formed over the semiconductor substrate 101 including the junction regions 105. In the case where contact holes are formed, the target etch layer 107 may become an interlayer dielectric layer. Hereinafter, the target etch layer is referred to as the interlayer dielectric layer 107. The hard mask film 109 is used for an etch process of forming contact holes in the interlayer dielectric layer 107. The hard mask film 109 may be formed of a nitride film, preferably, an amorphous carbon film. The etch-stop film 111 protects the hard mask film 109 when depositing and etching films formed on the hard mask film 109 in a subsequent process. Thus, the etch-stop film 111 is preferably formed using material with an etch selectivity greater than that of the films formed in a subsequent process. For example, the etch-stop film 111 may be formed of a SiON film.

Figure 1B:
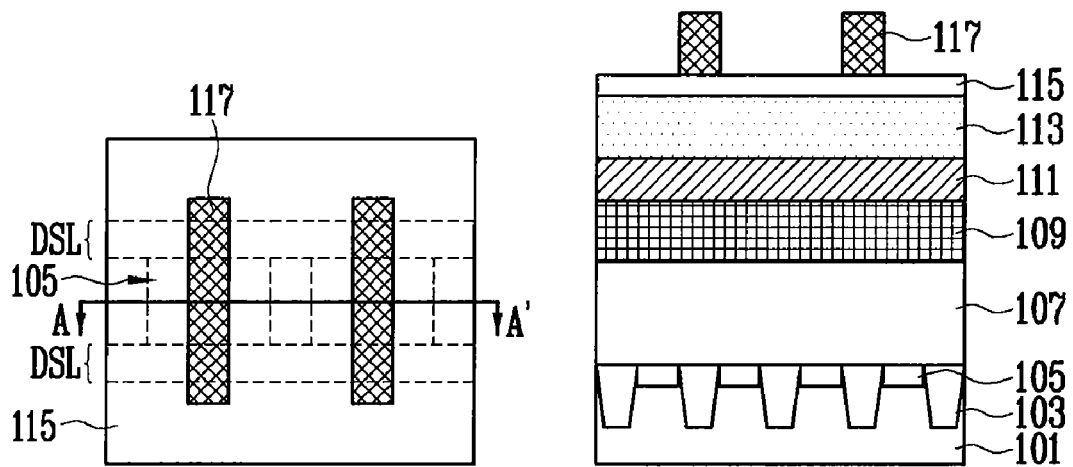
Figure 1C:
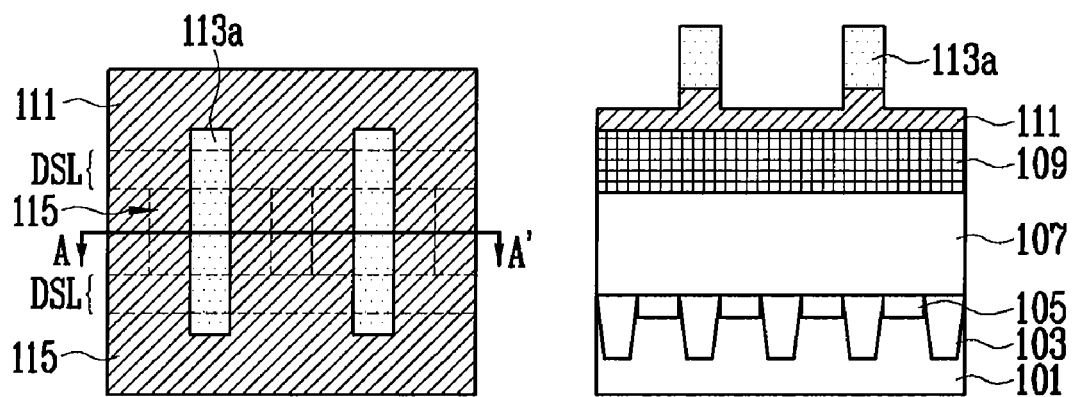

Referring to FIG. 1B, a first etch mask film 113, a first Anti-Reflective Coating (ARC) layer 115 and first photoresist patterns 117 are formed over the etch-stop film 111. The first etch mask film 113 is formed using material with an etch selectivity that is different from that of the etch-stop film 111, preferably, a Si-containing Bottom Anti-Reflective Coating (BARC) film. The Si-containing BARC film can be formed using a spin-coating method and preferably experiences a subsequent baking process for curing. In the case where the first etch mask film 113 is formed of a Si-containing BARC film, a key open process of exposing an alignment key (not shown), such as an overlay vernier formed in a scribe lane, during an exposure process for forming the first photoresist patterns 117 can be omitted since the Si-containing BARC film is a transparent material. If the first etch mask film 113 can perform an anti-reflection function during the exposure process of the photoresist, the first ARC layer 115 may be omitted.

The first photoresist patterns 117 are formed to have a pitch that can be implemented as small as possible in an exposure apparatus. The pitch of the first photoresist patterns 117 is set to approximately twice the pitch of target patterns (i.e., contact holes). That is, the first photoresist patterns 117 are formed at a pitch approximately twice the pitch of the contact holes. Furthermore, the first photoresist patterns 117 are preferably formed on the first ARC layer 115 between regions where the contact holes will be formed (i.e., the junction regions) in a direction crossing the drain select line DSL. Consequently, the first photoresist patterns 117 extend in the direction of the drain select line DSL on the first ARC layer 115 in the regions where the isolation layers 103 are formed. In particular, the first photoresist patterns 117 are preferably formed longer than a distance between the drain select lines DSL to cross the drain select lines DSL. In other words, the length of the first photoresist pattern 117 is preferably longer than that of the contact hole to be formed between the drain select lines DSL.

Referring to FIG. 5C, the first ARC layer 115 and the first etch mask film 113 are etched using the first photoresist patterns 117 as an etch mask. Thus, first etch mask patterns 113a are formed corresponding to the first photoresist patterns 117. The first photoresist patterns 117 and the first ARC layer 115 are then removed. When the first etch mask film 113 is etched, the hard mask film 109 is protected by the etch-stop film 111.

Figure 1D:
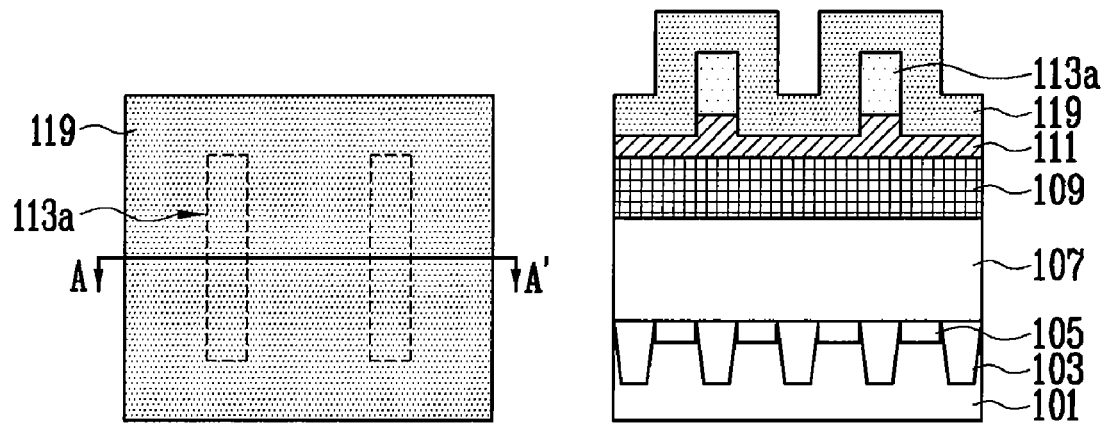

Referring to FIG. 1D, an auxiliary film 119 is formed over the semiconductor substrate 101 to the extent that the step generated by the first etch mask patterns 113a can be maintained. The auxiliary film 119 is preferably formed of a carbon polymer film. The thickness of the auxiliary film 119 formed on the sidewalls of the first etch mask patterns 113a indicates a distance between second etch mask patterns 121a, which will be formed in a subsequent process, and the first etch mask patterns 113a, that is, the width of target patterns (for example, the contact holes). The thickness of the auxiliary film 119 formed on the sidewalls of the first etch mask patterns 113a is maintained at a thickness corresponding to the width of the contact holes.

Alternatively, an etch process may be performed such that the auxiliary film 119 remains only on the sidewalls of the first etch mask patterns 113a in a spacer form. In this case, the second etch mask patterns (refer to 121a of FIG. 1F), which will be formed in a subsequent process, can have a greater height.

Figure 1E:
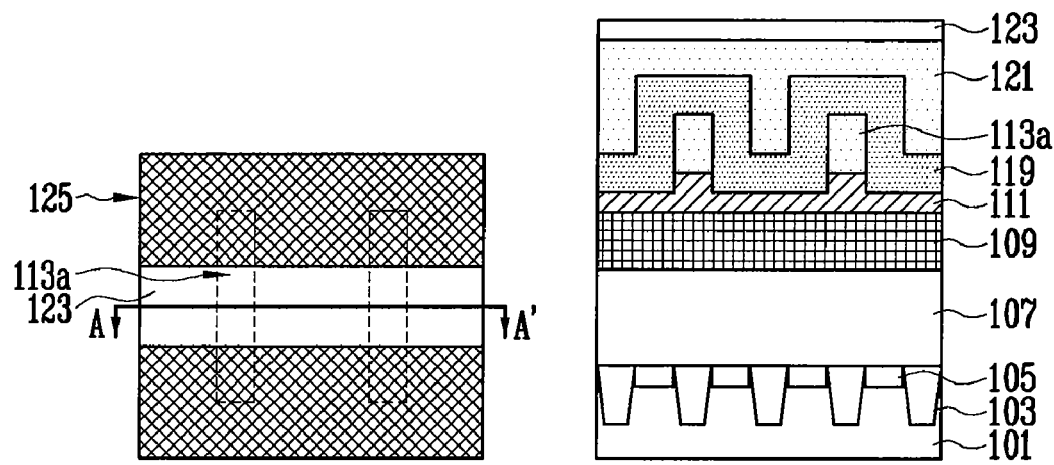

Referring to FIG. 1E, a second etch mask film 121 is formed on the auxiliary film 119 such that a concave (凹) portion (i.e., between the auxiliary films formed on the sidewalls of the first etch mask patterns), which has a low step by the first etch mask patterns 113a, is fully gap filled. The second etch mask film 121 is preferably formed using the same material as that of the first etch mask patterns 113a. Alternatively, the second etch mask film 121 may be formed using a Si-containing BARC film. The Si-containing BARC film can be formed using a spin-coating method and may experience a subsequent baking process for curing. If the Si-containing BARC film is formed using the spin-coating method, the Si-containing BARC film can be formed without voids in a space having a high aspect ratio.

A second ARC layer 123 is formed on the second etch mask film 121. If the second etch mask film 121 can perform an anti-reflection function during an exposure process of the photoresist film, the second ARC layer 123 may be omitted.

A second photoresist pattern 125 is formed on the second ARC layer 123. The second photoresist pattern 125 is formed such that regions where target patterns will be formed (that is, regions where the contact holes will be formed) are exposed and may be formed such that the regions between the contact holes are also exposed. A distance exposed by the second photoresist pattern 125 is preferably identical to or smaller than the distance between the drain select lines DSL. Thus, the second ARC layer 123 is exposed between the second photoresist patterns 125. When the second ARC layer 123 is not formed, the second etch mask film 121 between the drain select lines DSL is exposed.

The second photoresist pattern 125 has a repetitive form through which between the drain select lines DSL are exposed. However, the second photoresist pattern 125 has a wide distance between the regions through which between the drain select lines DSL are exposed when compared with the first photoresist patterns (refer to 117 of FIG. 1C). Thus, an interference phenomenon is rarely generated during an exposure process and the likelihood of misalignment during the process is relatively small since the distance between the drain select lines DSL is wide.

Figure 1F:
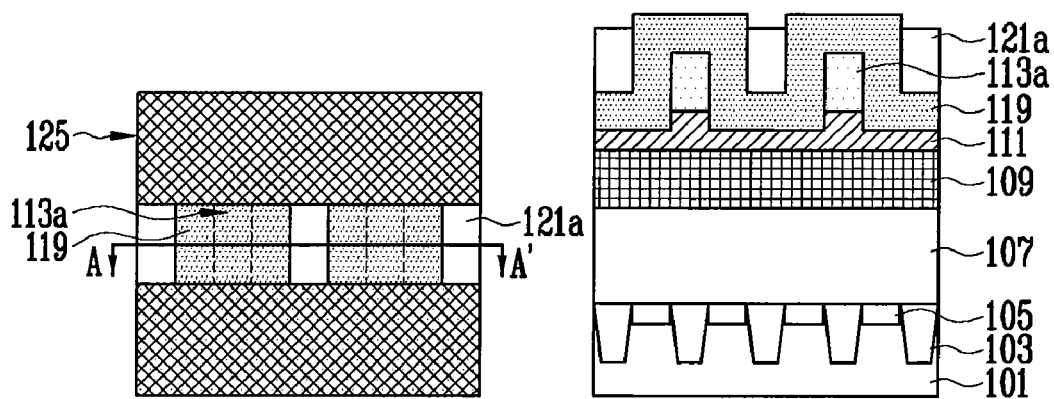

Referring to FIG. 1F, the second ARC layer 123 exposed between the second photoresist patterns 125 is removed such that a part of the second etch mask film 121 is exposed. The second etch mask film 121 is then etched such that the exposed portion of the second etch mask film 121 remains only on the auxiliary film 119 of the concave (凹) portion between the first etch mask patterns 113a, thereby forming the second etch mask patterns 121a. Accordingly, the second etch mask patterns 121a are automatically aligned between the first etch mask patterns 113a on the auxiliary film 119 in the regions where the drain select lines DSL are formed. The second etch mask patterns 121a have a pitch, which is approximately twice the pitch of target patterns (similar to the first etch mask patterns 113a). Furthermore, the distance between the first etch mask patterns 113a and the second etch mask patterns 121a is defined by the thickness of the auxiliary film 119 formed on the sidewalls of the first etch mask patterns 113a. In particular, if the thickness of the auxiliary film 119 formed on both sidewalls of the first etch mask patterns 113a is substantially uniform, the second etch mask patterns 121a are aligned automatically at the center between the first etch mask patterns 113a.

As the second etch mask patterns 121a are formed, the auxiliary film 119 formed on the sidewalls and on the first etch mask patterns 113a is exposed between the second etch mask patterns 121a (i.e., between the regions in which the drain select lines DSL are formed).

Figure 1G:
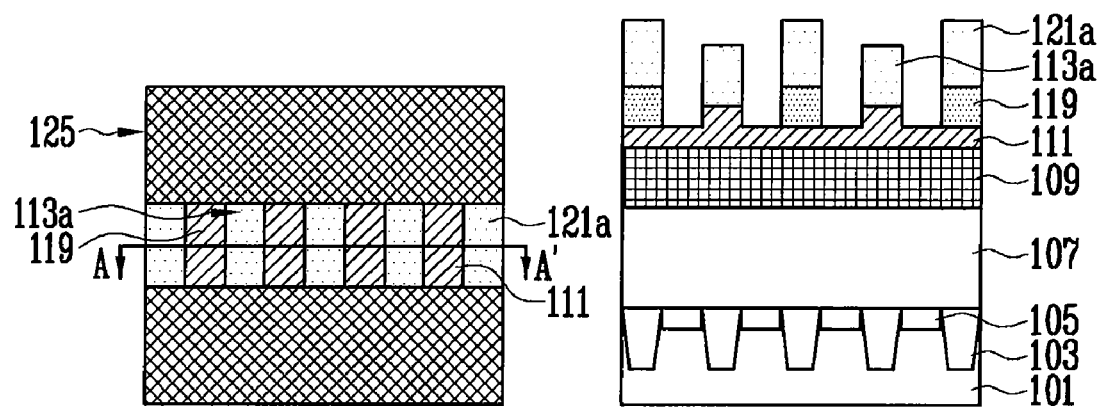

Referring to FIG. 1G the exposed portions of the auxiliary film 119 between the second photoresist patterns 125 are removed. Thus, the etch-stop film 111 of regions where target patterns (i.e., the contact holes) will be formed is exposed. The first and second etch mask patterns 113a, 121a are alternately exposed between the regions where the contact holes will be formed.

The auxiliary film 119 is preferably removed by an etch process using $O_2$ plasma. When etching the auxiliary film 119, $O_2$ reacts to Si components of the second etch mask patterns 121a including the Si-containing BARC film, such that a silicon oxide film is formed. The silicon oxide film hinders etching when the auxiliary film 119 is etched, such that etching of the second etch mask patterns 121a can be minimized.

Figure 1H:
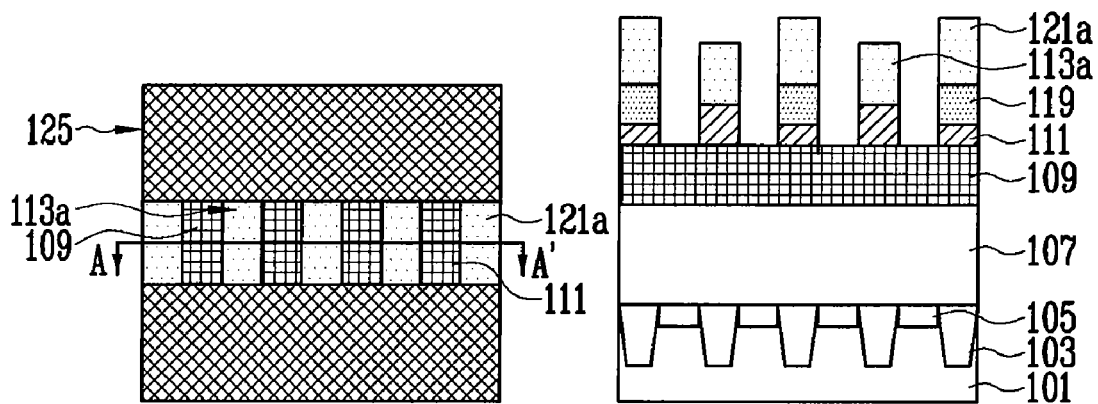

Referring to FIG. 1H, the etch-stop film 111 exposed between the first and second etch mask patterns 113a, 121a is removed. Thus, the hard mask film 109 in the regions where the target patterns (i.e., the contact holes) will be formed is exposed.

Figure 1I:
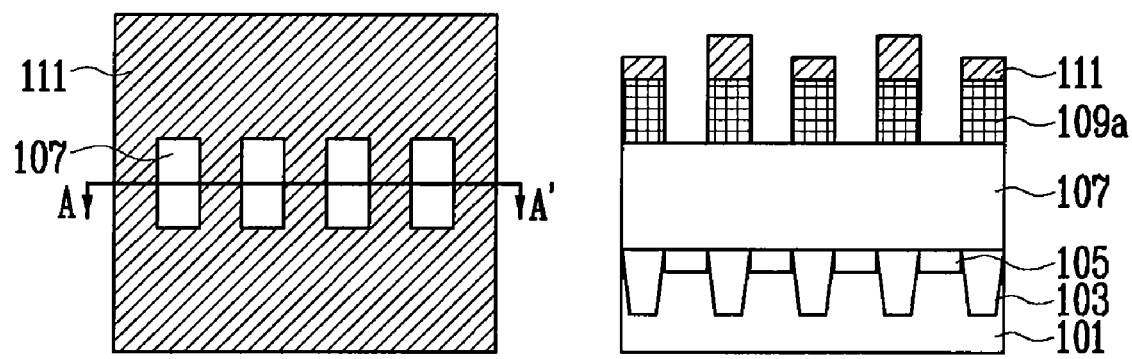

Referring to FIG. 1I, the exposed portions of the hard mask film 109 are etched, thereby forming hard mask patterns 109a. The second photoresist patterns 125 are then removed. The second photoresist patterns 125 may be removed before the hard mask films 109 are etched. Alternatively, when the hard mask films 109 are etched, the first and second etch mask patterns 113a, 121a and the auxiliary film 119 may be removed together. The interlayer dielectric layer 107 in the regions where the contact holes will be formed is exposed between the hard mask patterns 109a.

Figure 1J:
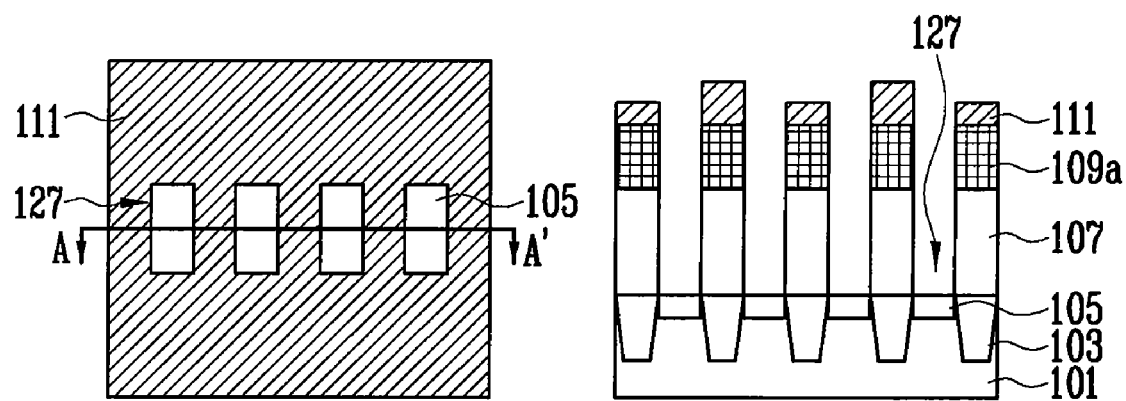

Referring to FIG. 1J, the interlayer dielectric layer 107 is removed by an etch process using the hard mask patterns 109a. Thus, the contact holes 127 through which the junction regions 105 are exposed are formed between the drain select lines DSL.

As described above, the hard mask patterns 109a are formed by patterning the hard mask film 109 using an etch process employing the first and second etch mask patterns 113a, 121a. The target etch layer 107 is then patterned by an etch process using the hard mask patterns 109a. However, the target etch layer 107 may be patterned directly by an etch process employing the first and second etch mask patterns 113a, 121a without using the hard mask film 109. In this case, the formation and etch processes of the hard mask film 109 may be omitted.

As described above, the present invention may have the following advantages.

First, during the exposure process to form the first etch mask patterns, the photoresist patterns having a pitch, which is approximately twice the pitch of target patterns, are formed. Thus, more micro patterns than are allowed by the resolution limit of an exposure apparatus can be formed.

Second, the second etch mask patterns are formed between the first etch mask patterns in a self-aligned manner. It is therefore possible to prevent misalignment.

Third, a distance between the first and second etch mask patterns can be controlled to a thickness of the auxiliary film formed on the sidewalls of the first etch mask patterns. Thus, the distance between the first and second etch mask patterns can be controlled more accurately.

Fourth, if the first etch mask patterns, the auxiliary film and the second etch mask patterns are formed of a transparent film such as the Si-containing BARC film or the carbon polymer film, a key open process for exposing an alignment key, such as an overlay vernier, in a subsequent exposure process can be omitted.

Fifth, if the etch process of the Si-containing BARC film and the deposition process of the carbon polymer film are maintained in a vacuum state within the same apparatus, the above processes can be carried out consecutively in-situ. Accordingly, a process condition can be maintained stably and the turnaround time can be shortened.

Sixth, if the Si-containing BARC film is formed using the spin-coating method as described above, a burial characteristic can be improved. Thus, the Si-containing BARC film can be formed easily without voids even in a space between micro patterns with a high aspect ratio.

The present invention is not limited to the disclosed embodiments, but may be implemented in various configurations. The embodiments are provided to complete the disclosure of the present invention and to allow those having ordinary skill in the art to understand the present invention. The present invention is defined by the scope of the claims.

What is claimed is:

1. A method of forming micro patterns of a semiconductor device, the method comprising:
   forming first etch mask patterns over a semiconductor substrate in which junction regions and isolation layers are alternately formed between drain select lines;
   forming an auxiliary film over the first etch mask patterns, wherein the auxiliary film is formed over sidewalls of the first etch mask patterns such that a space is defined between adjacent first etch mask patterns;
   forming a second etch mask film over an entire structure including the auxiliary film, wherein the first etch mask patterns and the second etch mask film comprise substantially the same material;
   forming a second photoresist pattern including an opening, wherein the opening is parallel to the drain select line and exposes a portion of the second etch mask film located between the drain select lines;
   etching the second etch mask film using the second photoresist pattern as an etching mask, wherein a second etch mask pattern is formed in the space defined between the adjacent first etch mask patterns; and
   removing the auxiliary film that is formed between the first and second etch mask patterns, wherein target patterns correspond to regions on the semiconductor substrate where the auxiliary film is removed.

2. The method of claim 1, further comprising:
   before the first etch mask patterns are formed,
   forming a hard mask film over the semiconductor substrate; and
   forming an etch-stop film over the hard mask film.

3. The method of claim 2, further comprising:
   after the auxiliary film is removed, etching the etch-stop film and the hard mask film using an etch process employing the first etch mask patterns and the second etch mask pattern to hard mask patterns.

4. The method of claim 1, wherein a pitch of the first etch mask patterns is approximately twice a pitch of the target patterns.

5. The method of claim 4, wherein a length of each first etch mask pattern between the target patterns is identical to or longer than a length of each target pattern.

6. The method of claim 1, wherein forming the first etch mask patterns comprises:
   forming a first etch mask film and an anti-reflective coating (ARC) layer over the semiconductor substrate;
   forming first photoresist patterns on the ARC layer, wherein the first photoresist patterns are formed to have a pitch which is twice a pitch of the target patterns;
   patterning the ARC layer and the first etch mask film using an etch process employing the first photoresist patterns to form the first etch mask patterns; and
   removing the first photoresist patterns and the ARC layer.

7. The method of claim 1, wherein a distance between the first etch mask patterns and the second etch mask pattern corresponds to a thickness of the auxiliary film formed on the sidewalls of the first etch mask patterns.

8. The method of claim 1, wherein a width of each target pattern corresponds to a thickness of the auxiliary film formed on the sidewalls of the first etch mask patterns.

9. The method of claim 1, wherein a plurality of second etch mask patterns are formed and a pitch of the second etch mask patterns is approximately twice a pitch of each target pattern.

10. The method of claim 1, wherein after the auxiliary film is removed, and the second photoresist pattern is removed.

11. The method of claim 1, wherein the first etch mask patterns and the second etch mask pattern comprise a Si-containing Bottom Anti-Reflective Coating (BARC) film.

12. The method of claim 11, wherein the Si-containing BARC film is formed using a spin-coating method.

13. The method of claim 1, wherein the auxiliary film comprises a carbon polymer film.

14. The method of claim 1, wherein removing the auxiliary film comprises etching the auxiliary film using $O_2$ plasma.

15. A method of forming micro patterns of a semiconductor device, the method comprising:
   providing a semiconductor substrate in which junction regions and isolation layers are alternately formed between drain select lines;
   forming an interlayer dielectric layer over the semiconductor substrate;
   forming first etch mask patterns over the interlayer dielectric layer at regions corresponding to isolation layers belonging to any one of an even-numbered group of the isolation layers and an odd-numbered group of the isolation layers;
   forming an auxiliary film over the interlayer dielectric layer including a surface of the first etch mask patterns, wherein the auxiliary film is formed over sidewalls of the first etch mask patterns such that a space is defined between adjacent first etch mask patterns;
   forming a second etch mask film over an entire structure including the auxiliary film;

forming a second photoresist pattern including an opening, wherein the opening is parallel to the drain select line and exposes a portion of the second etch mask film located between the drain select lines;

etching the second etch mask film using the second photoresist pattern as an etching mask, wherein a second etch mask pattern is formed in the space defined between the adjacent first etch mask patterns;

removing the auxiliary film that is formed between the first and second etch mask patterns; and etching the interlayer dielectric layer at regions from which the auxiliary film has been removed to form contact holes.

16. The method of claim 15, wherein each first etch mask pattern is formed to have a length that is longer than a length of the junction region in a direction in which the junction regions are formed.

17. The method of claim 15, wherein the junction regions and the isolation layers are formed alternately between drain select lines of a NAND flash memory device.

18. The method of claim 17, wherein each first etch mask pattern is formed to have a length that is longer than a distance between the drain select lines in a direction crossing the drain select lines.

19. The method of claim 15, further comprising:
before the first etch mask patterns are formed,
forming a hard mask film over the interlayer dielectric layer; and
forming an etch-stop film over the hard mask film.

20. The method of claim 19, further comprising:
before etching the interlayer dielectric layer,
etching the etch-stop film and the hard mask film using an etch process employing the first etch mask patterns and the second etch mask pattern to form hard mask patterns.

21. The method of claim 15, wherein forming the first etch mask patterns comprises:
forming a first etch mask film and an ARC layer over the interlayer dielectric layer;
forming first photoresist patterns on the ARC layer at regions corresponding to the isolation layers belonging to any one of the even-numbered group of the isolation layers and the odd-numbered group of the isolation layers;
patterning the ARC layer and the first etch mask film using an etch process employing the first photoresist patterns to form the first etch mask patterns; and
removing the first photoresist patterns and the ARC layer.

22. The method of claim 15, wherein a distance between the first etch mask patterns and the second etch mask pattern corresponds to a thickness of the auxiliary film formed on the sidewalls of the first etch mask patterns.

23. The method of claim 15, wherein a width of the contact hole corresponds to a thickness of the auxiliary film formed on the sidewalls of the first etch mask patterns.

24. The method of claim 15, wherein the second etch mask pattern is formed in a region corresponding to the isolation layers belonging to the other one of the even-numbered group of the isolation layers and the odd-numbered group of the isolation layers.

25. The method of claim 15,
wherein after the auxiliary film is removed, the second photoresist pattern is removed.

26. The method of claim 15, wherein the first etch mask patterns and the second etch mask pattern comprise a Si-containing BARC film.

27. The method of claim 26, wherein the Si-containing BARC film is formed using a spin-coating method.

28. The method of claim 15, wherein the auxiliary film comprises a carbon polymer film.

29. The method of claim 15, wherein removing the auxiliary film comprises etching the auxiliary film using $O_2$ plasma.

30. A method of forming micro patterns of a semiconductor device, the method comprising:
providing a semiconductor substrate having alternately formed junction regions and isolation structures between drain select lines, wherein the isolation structures include an even-numbered group of the isolation structures and an odd-numbered group of the isolation structures;

forming first etch mask patterns using a transparent material over the semiconductor substrate at regions corresponding to the isolation structures belonging to one of the even-numbered group and the odd-numbered group;

forming an auxiliary film over the first etch mask patterns, wherein the auxiliary film is formed over sidewalls of the first etch mask patterns such that a space is defined between adjacent first etch mask patterns;

forming a second etch mask film over an entire structure including the auxiliary film;

forming a photoresist pattern including an opening, wherein the opening is parallel to the drain select line and exposes a portion of the second etch mask film located between the drain select lines;

etching the second etch mask film using the second photoresist pattern as an etching mask, wherein a second etch mask pattern is formed in the space defined between the adjacent first etch mask patterns; and removing the auxiliary film that is formed between the first and second etch mask patterns.

* * * * *